US006465359B2

(12) United States Patent
Yamada et al.

(10) Patent No.: US 6,465,359 B2
(45) Date of Patent: *Oct. 15, 2002

(54) ETCHANT FOR USE IN A SEMICONDUCTOR PROCESSING METHOD AND SYSTEM

(75) Inventors: Masahiro Yamada; Youbun Ito; Kouichiro Inazawa, all of Tokyo-to (JP); Abron Toure, Beverly, MA (US); Kunihiko Hinata, Beverly, MA (US); Hiromi Sakima, Beverly, MA (US)

(73) Assignee: Tokyo Electron Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/398,472

(22) Filed: Sep. 17, 1999

(65) Prior Publication Data

US 2002/0030174 A1 Mar. 14, 2002

Related U.S. Application Data

(62) Division of application No. 09/087,848, filed on Jun. 1, 1998, now Pat. No. 6,159,862.

(30) Foreign Application Priority Data

Dec. 27, 1997 (JP) .............................................. 9-368081

(51) Int. Cl.[7] .................. H01L 21/302; H01L 21/3065; C09K 13/00; C09K 13/06
(52) U.S. Cl. ...................... 438/706; 438/712; 438/723; 438/724; 252/79.1; 252/79.4
(58) Field of Search ................................. 438/706, 723, 438/724, 712; 252/79.1, 79.4

(56) References Cited

U.S. PATENT DOCUMENTS

| 5,338,399 A | * | 8/1994 | Yanagida ...................... 216/67 |
| 5,650,339 A | * | 7/1997 | Saito et al. .................. 438/164 |
| 5,767,017 A | * | 6/1998 | Armacost et al. ........... 438/694 |
| 5,767,019 A | * | 6/1998 | Kim et al. ................... 438/696 |
| 5,780,338 A | * | 7/1998 | Jeng et al. .................. 438/253 |
| 6,159,862 A | * | 12/2000 | Yamada et al. ............. 438/712 |

FOREIGN PATENT DOCUMENTS

JP      11186229 A   *   7/1999   ....... H01L/21/3065

OTHER PUBLICATIONS

Toshiba KK, Dry etching of layer insulation film for forming self–adjusting contact—by supplying carbon fluoride gas and nitrogen gas at specific flow rates for selective etching of silicon oxide layer, English Abstract of JP 11186229 A, 2 pages, Jul. 1999.*

Inazaea, K., Etching Process, PCT No. WO99/34419, 26 pages, Jul. 1999.*

* cited by examiner

Primary Examiner—Benjamin L. Utech
Assistant Examiner—Lynette T. Umez-Eronini
(74) Attorney, Agent, or Firm—Oblon, Spivak, McClelland, Maier & Neustadt, P.C.

(57) ABSTRACT

A method and system for processing a substrate in the presence of high purity $C_5F_8$. When processing oxides and dielectrics in a gas plasma processing system, $C_5F_8$ is used in combination with a carrier gas (e.g., Ar) and one or more of CO and $O_2$. When using a silicon nitride ($Si_xN_y$) layer as an etch stop, effective etching is performed due to the selectivity of oxides versus silicon nitride. The method is used when etching down to self-aligning contacts and other layers. The method may be practiced with or without using an anti-reflective coating underneath the photoresist layer.

5 Claims, 16 Drawing Sheets

FIG. 17A

RESULTS: OXIDE  
PROCESS: 50ml 1500W

| RUN | C5F8(sccm) | CO | Ar | O2 | MAX(A/m) | MIN(A/m) | MEA (A/m) | UNIF. | STD. DEV |
|---|---|---|---|---|---|---|---|---|---|
| 1 | 7 | 0 | 500 | 0 | 2760 | -14 | 1327 | 104.50 | 1119 |
| 2 | 7 | 100 | 500 | 6 | 1962 | 1827 | 1905 | 3.57 | 48 |
| 3 | 7 | 0 | 500 | 6 | 2301 | 2199 | 2239 | 2.27 | 33 |
| 4 | 11 | 0 | 500 | 6 | 3229 | 3081 | 3141 | 2.35 | 52 |
| 5 | 11 | 50 | 500 | 3 | 2637 | 2449 | 2529 | 3.69 | 75 |
| 6 | 9 | 100 | 500 | 0 | 3235 | 3098 | 3153 | 2.17 | 49 |
| 7 | 11 | 100 | 500 | 6 | -831 | -1049 | -982 | -11.10 | -79 |
| 8 | 11 | 100 | 500 | 0 | 2788 | 2655 | 2707 | 2.46 | 48 |
| 9 | 7 | 100 | 500 | 0 | 2562 | -377 | 967 | 151.90 | 1439 |
| 10 | 5 | 100 | 500 | 0 | 1656 | 1532 | 1579 | 3.94 | 48 |
| 11 | 15 | 100 | 500 | 0 | -1477 | -1539 | -1506 | -2.08 | 22 |

FIG. 17B

RESULTS: SIN  
PROCESS: 50ml 1500W

| RUN | C5F8(sccm) | CO | Ar | O2 | MAX(A/m) | MIN(A/m) | MEA (A/m) | UNIF. | STD. DEV |
|---|---|---|---|---|---|---|---|---|---|
| 1 | 7 | 0 | 500 | 0 | -149 | -195 | -174 | -13.29 | -13 |
| 2 | 7 | 100 | 500 | 6 | 241 | 230 | 235 | 2.27 | 4 |
| 3 | 7 | 0 | 500 | 6 | 324 | 279 | 305 | 7.43 | 21 |
| 4 | 11 | 0 | 500 | 6 | 191 | 130 | 164 | 18.63 | 26 |
| 5 | 11 | 50 | 500 | 3 | 2604 | 305 | 1853 | 62.02 | 911 |
| 6 | 9 | 100 | 500 | 0 | 28 | -4 | 13 | 117.98 | 9 |
| 7 | 11 | 100 | 500 | 6 | 2521 | -1271 | 1383 | 137.09 | 1488 |
| 8 | 11 | 100 | 500 | 0 | 105 | 88 | 98 | 8.75 | 5 |
| 9 | 7 | 100 | 500 | 0 | -102 | -225 | -176 | -34.83 | 48 |
| 10 | 5 | 100 | 500 | 0 | -7 | -148 | -89 | -76.94 | 59 |
| 11 | 15 | 100 | 500 | 0 | 193 | -1341 | -816 | -93.96 | 764 |

RESULTS:OXIDE AFTER 3 MIN ASHING

| RUN | C5F8(sccm) | CO | Ar | O2 | MAX(A/m) | MIN,(A/m) | MEA (A/m) | UNIF. | STD. DEV |
|---|---|---|---|---|---|---|---|---|---|
| 1 | 7 | 0 | 500 | 0 | 2856 | 571 | 1673 | 68.27 | 935 |
| 2 | 7 | 100 | 500 | 6 | | | | | |
| 3 | 7 | 0 | 500 | 6 | | | | | |
| 4 | 11 | 0 | 500 | 6 | | | | | |
| 5 | 11 | 50 | 500 | 0 | 200 | 107 | 140 | 33.03 | 31 |
| 6 | 9 | 100 | 500 | 3 | | | | | |
| 7 | 11 | 100 | 500 | 0 | 2597 | 319 | 1376 | 82.77 | 1124 |
| 8 | 11 | 100 | 500 | 6 | | | | | |
| 9 | 7 | 100 | 500 | 0 | | | | | |

FIG. 17C

RESULTS:SIN AFTER 3 MIN ASHING

| RUN | C5F8(sccm) | CO | Ar | O2 | MAX(A/m) | MIN,(A/m) | MEA (A/m) | UNIF. | STD. DEV |
|---|---|---|---|---|---|---|---|---|---|
| 1 | 7 | 0 | 500 | 0 | 52 | 37 | 43 | 17.53 | 6 |
| 2 | 7 | 100 | 500 | 6 | | | | | |
| 3 | 7 | 0 | 500 | 6 | | | | | |
| 4 | 11 | 0 | 500 | 6 | | | | | |
| 5 | 11 | 50 | 500 | 0 | 42 | 29 | 33 | 18.99 | 4 |
| 6 | 9 | 100 | 500 | 3 | 50 | 64 | 64 | 19.92 | 8 |
| 7 | 11 | 100 | 500 | 0 | 45 | 28 | 34 | 25.61 | 7 |
| 8 | 11 | 100 | 500 | 6 | 153 | 136 | 146 | 5.72 | 5 |
| 9 | 7 | 100 | 500 | 0 | 53 | 33 | 41 | 42.77 | 8 |

FIG. 17D

ETCHANT FOR USE IN A SEMICONDUCTOR PROCESSING METHOD AND SYSTEM

The present application claims priority under 35 U.S.C. 119 to Japanese patent application 9-368081 filed Dec. 27, 1997, the contents of which are incorporated herein by reference and is a divisional of 09087848 filed Jun. 1, 1998 now U.S. Pat. No. 6,159,862.

BACKGROUND OF THE INVENTION

1. Field of the Invention

The present invention provides a semiconductor plasma processing method and system using novel combinations of gases including $C_5F_8$. In an exemplary preferred form of the invention, $C_5F_8$ is utilized in combination with CO and/or $O_2$ in the presence of a carrier gas, e.g., Argon.

2. Discussion of the Background

Integrated circuits and other electrical devices are today manufactured utilizing plural plasma processing steps, in which the plasma interacts with a substrate (e.g., a semiconductor wafer) to (1) deposit material onto the substrate in layers, or (2) etch the various layers formed on the substrate. Deposition and etching are not always mutually exclusive since, e.g., during an etching operation, materials can also be deposited.

When fabricating semiconductor devices, numerous regions having different electrical properties (e.g., conductive regions, non-conductive regions, etc.) are formed in layers on and upon the semiconductor substrate. The conductive regions include a semiconductor substrate, a source or drain region, the gate material of a gate electrode, and a conductive material. Non-limiting examples of suitable conductive regions include a metal such as aluminum, polysilicon (which may be conventionally doped with n-dopants such a phosphorous, arsenic, antimony, sulfur, etc., or with p-dopants such as boron), titanium, tungsten, copper, and conductive alloys thereof such as aluminum-copper alloy and titanium-tungsten alloy.

The conductive regions and layers of the device are isolated from one another by a dielectric, for example, silicon dioxide. The silicon dioxide may be (1) grown, (2) deposited by physical deposition (e.g., sputtering), or (3) deposited by chemical deposition. Additionally, the silicon dioxide may be undoped or doped, for example, with boron, phosphorus, or both, to form borosilicate glass (BSG), phosphosilicate glass (PSG), and borophosphosilicate glass (BPSG), respectively. The method used to form and dope a silicon dioxide layer will depend upon various device and processing considerations. Herein, all such silicon dioxide layers are referred to generally as "oxide" layers.

At several stages during fabrication, it is necessary to make openings in a dielectric layer to contact underlying regions or layers. Generally, an opening through a dielectric layer between polysilicon and the first metal layer is called a "contact opening," while an opening in other oxide layers such as an opening through an intermetal dielectric layer (ILD) is referred to as a "via." As used herein, an "opening" will be understood to refer to any type of opening through any type of oxide layer, regardless of the stage of processing, layer exposed, or function of the opening.

The positions and sizes of the openings are defined by photolithographic masks. Typically, a photosensitive film (or resist) is deposited on the surface of a dielectric layer, and the photolithographic mask blocks a portion of the light which would otherwise expose a corresponding portion of the film when the film is exposed to a light of a known intensity and frequency. Suitable photoresist materials are those conventionally known to those of ordinary skill in the art and may comprise either positive or negative photoresist materials. Either or both positive and/or negative resist layers may be used. The photoresist may be applied by conventional methods known to those of ordinary skill in the art.

Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation of suitable negative resist materials is within the level of skill of one of ordinary skill in the art without undue experimentation. Specific non-limiting examples of suitable negative resist systems include cresol epoxy novolac-based negative resists as well as negative resists containing the photoreactive polymers described in Kirk-Othmer Encyclopedia of Chemical Technology, 3rd Edition, Vol. 17, entitled "Photoreactive Polymers", pages 680–708, the relevant portions of which are hereby incorporated by reference.

Positive resists have photoreactive components which are destroyed in the regions exposed to light. Typically the resist is removed in an aqueous alkaline solution, where the exposed region dissolves away. The preparation of suitable positive resist materials is within the level of skill of one of ordinary skill in the art without undue experimentation. Specific non-limiting examples of suitable positive resist systems include Shipley XP9402, JSR KRK-K2G and JSR KRF-L7 positive resists as well as positive resists containing the photoreactive polymers described in Kirk-Othmer Encyclopedia of Chemical Technology, 3rd Edition, Vol. 17, entitled "Photoreactive Polymers", pages 680–708, the relevant portions of which are hereby incorporated by reference.

Exemplary resist materials are also described by Bayer et al., IBM Tech. Discl. Bull. (USA) Vol. 22, No. 5, (October 1979), pp. 1855; Tabei, U.S. Pat. No. 4,613,404; Taylor et al., 3. Vac. Sci., Technol. Bull. Vol. 13, No. 6, (1995), pp. 3078–3081; Argritis et al., J. Vac. Sci., Technol. Bull., Vol. 13, No. 6, (1995), pp. 3030–3034; Itani et al., J. Vac. Sci, Technol. Bull. Vol. 13, No. 6, (1995), pp. 3026–3029; Ohfuli et al., J. Vac. Sci, Technol. Bull. Vol. 13, No. 6, (1995), pp. 3022–3025; Trichkov et al., J. Vac. Sci., Technol. Bull. Vol. 13, No. 6, (1995), pp. 2986–2993; Capodieci et al., J. Vac. Sci, Technol. Bull. Vol. 13, No. 6, (1995), pp. 2963–2967; Zuniga et al., J. Vac. Sci, Technol. Bull. Vol. 13, No. 6, (1995), pp. 2957–2962; Xiao et al., J. Vac. Sci, Technol. Bull. Vol. 13, No. 6, (1995), pp. 2897–2903; Tan et al., J. Vac. Sci, Technol. Bull. Vol. 13, No. 6, (1995), pp. 2539–2544; and Mayone et al., J. Vac. Sci, Technol. Vol. 12, No. 6, pp. 1382–1382. The relevant portions of the above-identified references which describe the preparation of resist materials are hereby incorporated by reference.

In recent years, the degrees of integration of semiconductor devices have been greatly improved, and accordingly, the size reduction of various elements formed on semiconductor substrates has become one of the essential technical requirements. In order to meet such a requirement, it is necessary to reduce the gap between respective gates (electrodes) formed above a semiconductor substrate, and when a contact hole is formed between such gates, it is also necessary to reduce the size of the contact hole. As the gap between gates has decreased, it has become difficult to form a microscopic contact hole at an accurate position due to limitations on the stepper alignment, etc. In recent years, therefore, a self-aligned contact method has been used where a protective film (base) (such as a silicon nitride(SiN, film) is formed on the surface of each gate to prevent the etching of the gates during the formation of a contact hole and wherein a contact hole is formed in the microscopic space between adjacent gates in a self-aligning manner.

Prior to etching, a photoresist (or film) is applied, exposed, and developed. Development of the film removes a portion of the film, thereby forming a pattern in which portions of the oxide are exposed. The exposed portions of the oxide may then be subject to selective etching to form a contact. Plasma-based etching processes such as reactive ion etching (RIE) are very common, however etching can also be performed by other methods, such as using a high density chamber or a DRM chamber. In the reverse process, deposition can be performed by plasma enhanced chemical vapor deposition. Typically, the plasma is generated by coupling radio frequency (RF) electromagnetic energy to the plasma. The RF energy is supplied by an RF generator coupled to a power supply. Since the plasma has a variable impedance, a matching network is employed to match the impedance of the power supply with that of the plasma. The matching network may include one or more capacitors and one or more inductors to achieve the match and thereby tune the RF power. Typically, the tuning may be done automatically by an automatic matching network (AMN). When tuned, most of the power output of the RF generator is coupled to the plasma. The power to the plasma is often referred to as forward power.

Etch characteristics are generally believed to be affected by polymer residues which deposit during the etch. For this reason, the fluorine to carbon ratio (F/C) in the plasma is considered an important factor in the etch. In general, a plasma with a high F/C ratio will have a faster etch rate than a plasma with a low F/C ratio. At very low F/C ratios (i.e., high carbon content), polymer deposition may occur and etching may be reduced. The etch rate as a function of the F/C ratio is typically different for different materials. This difference is used to create a selective etch, by attempting to use a gas mixture which puts the F/C ratio in the plasma at a value that leads to etching at a reasonable rate for one material, and that leads to little or no etching or polymer deposition for another. For a more thorough discussion of oxide etching, see S. Wolf and R. N. Tauber, *Silicon Processing for the VLSI ERA*, Volume 1, pp 539–585 (1986), the contents of which are incorporated herein by reference. The introduction of oxygen into an etching process has been reported to allow for control of the anisotropy, by varying the fraction of $O_2$ in the feed. For example, see Burton et al., J. Electrochem. Soc.: Solid-State Science and Technology, v 129, no 7, 1599 (1982), the contents of which are incorporated herein by reference.

A number of gases have been used in known systems to etch oxide layers, including $CHF_3$, $CF_4$, and $CH_2F_2$. By selecting the appropriate gas for use in the etching process, some layers are selectively etched while leaving other layers (etch stops) relatively unharmed. $CH_2F_2$ has also been used and tends to provide a passivation layer on horizontal surfaces. A mixed gas obtained by adding CO to $C_4F_8$ is known to be used during etching to form contact holes, especially during an etching process which forms a contact hole between gates and through an insulating film such as an $SiO_2$ film.

$C_4F_8$, however, is not easily decomposed in the atmosphere. Consequently, any $C_4F_8$ that is not dissociated during processing and which is subsequently released into the atmosphere contributes to greenhouse effects and thus accelerates global warming. In other words, according to "PFC Problems in Semiconductor Mass Production Plants: Current States and Countermeasures," *Climate Change*1995, the atmospheric life of $C_4F_8$ is 3,200 years, whereas the atmospheric life of $C_5F_8$ is 0.3 years.

Previous unsuccessful attempts have been made to use $C_5F_8$ in a plasma processing systems. Such attempts were unsuccessful since they failed to provide the required selectivity. It is believed that a major impediment to the use of $C_5F_8$ was the low purity of previously available $C_5F_8$ gases. Generally, available $C_5F_8$ gases were only 95–97% pure. As a result, contamination created an unacceptable, non-uniform product because of non-uniform etch and deposition rates.

Accordingly, $C_5F_8$ was not previously accepted as an etchant for uniformly processing semiconductor substrates. Furthermore, the high selectivity of $C_5F_8$ for oxide versus silicon nitrides was unproven. $C_5F_8$, in the form of octofluro-cyclopentene is now available in high purity from Nippon Zeon Co., Ltd. of 2-6-1 Marunouchi, Chiyoda-ku, Tokyo 100 Japan.

SUMMARY OF THE INVENTION

It is an object of the present invention to provide an oxide etching method in which etching is effectively stopped at an etch stop.

Another object of the present invention is to provide an etching method which achieves a high selectivity ratio of oxide etch to etch of an etch stop.

These and other aspects of the present invention are made possible by a first embodiment of an improved gas plasma processing system utilizing a mixture of a high purity $C_5F_8$ gas in combination with a carrier gas (such as Ne, Kr, Xe, He, Ar, and $N_2$).

These and other objects are also made possible by a second embodiment of an improved gas plasma processing system utilizing a mixture of a high purity $C_5F_8$ gas in combination with a carrier gas and at least one of CO and $O_2$. In both the first and second embodiments, the mixture is introduced into a hermetic treatment chamber holding a substrate to be processed, wherein the substrate includes an $SiO_2$ layer above an $SiN_x$ layer.

It is known that $C_5F_8$ is decomposed in the atmosphere within a relatively brief period of time in comparison to other $C_xF_y$ gases which have heretofore been employed as treatment gases, such as $CF_4$, $C_2F_6$, $C_4F_8$. When $C_5F_8$ is employed as a treatment gas, therefore, $C_5F_8$ does not contribute to the greenhouse effect even if it is directly released into the atmosphere, thereby preventing global warming. $C_5F_8$, furthermore, is more carbon-rich than the $C_xF_y$ gases such as $CF_4$, $C_2F_6$, $C_4F_8$, and, therefore, it is easily capable of forming a carbon layer on the treatment surface of a substrate. As a result, the selection ratio is improved, and a desired etching process is performed on the treatment object (e.g., silicon wafer). In addition, when using $C_5F_8$ and $O_2$ to form a contact hole, the quantity of a polymer generated within the contact hole can be controlled due to the presence of $O_2$ within the gas mixture. As a result, the contact hole angle can be controlled, and the occurrences of etching stoppages can also be prevented.

The above objects also are realized by a third embodiment that utilizes a gas mixture introduced into a hermetic treatment chamber that houses a substrate having an $SiO_2$ layer above an $SiN_x$ layer. The process etches the $SiO_2$ layer using a gas mixture that includes at least $C_4F_8$ and CO until the $SiN_x$ layer is exposed, and subsequently etches the $SiO_2$ layer using $C_5F_8$ and at least one of CO and $O_2$ after said $SiN_x$ layer has been exposed.

According to the third embodiment, a gas mixture which includes $C_4F_8$ is used only until the $SiN_x$ layer is exposed, and therefore, the relative quantity of $C_4F_8$, which is not easily decomposed can be reduced. If $C_4F_8$ is thus used until the exposure of the $SiN_x$ layer when a contact hole is formed on an $SiO_2$ layer, then the formation of a carbon layer is inhibited, as a result the bottom plane of the contact hole can be properly etched. If $C_5F_8$ is used after the $SiN_x$ layer has been exposed, a carbon layer also can easily be formed, and the selection ratio of the $SiO_2$ with respect to $SiN_x$ can be improved.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIGS. 17A–17D are tables of results showing the effects of $C_5F_8$ and additional gases on the etching of layers of oxide, SiN, oxide after ashing, and SiN after ashing, respectively;

DETAILED DESCRIPTION OF THE PREFERRED EMBODIMENTS

Figure 1:
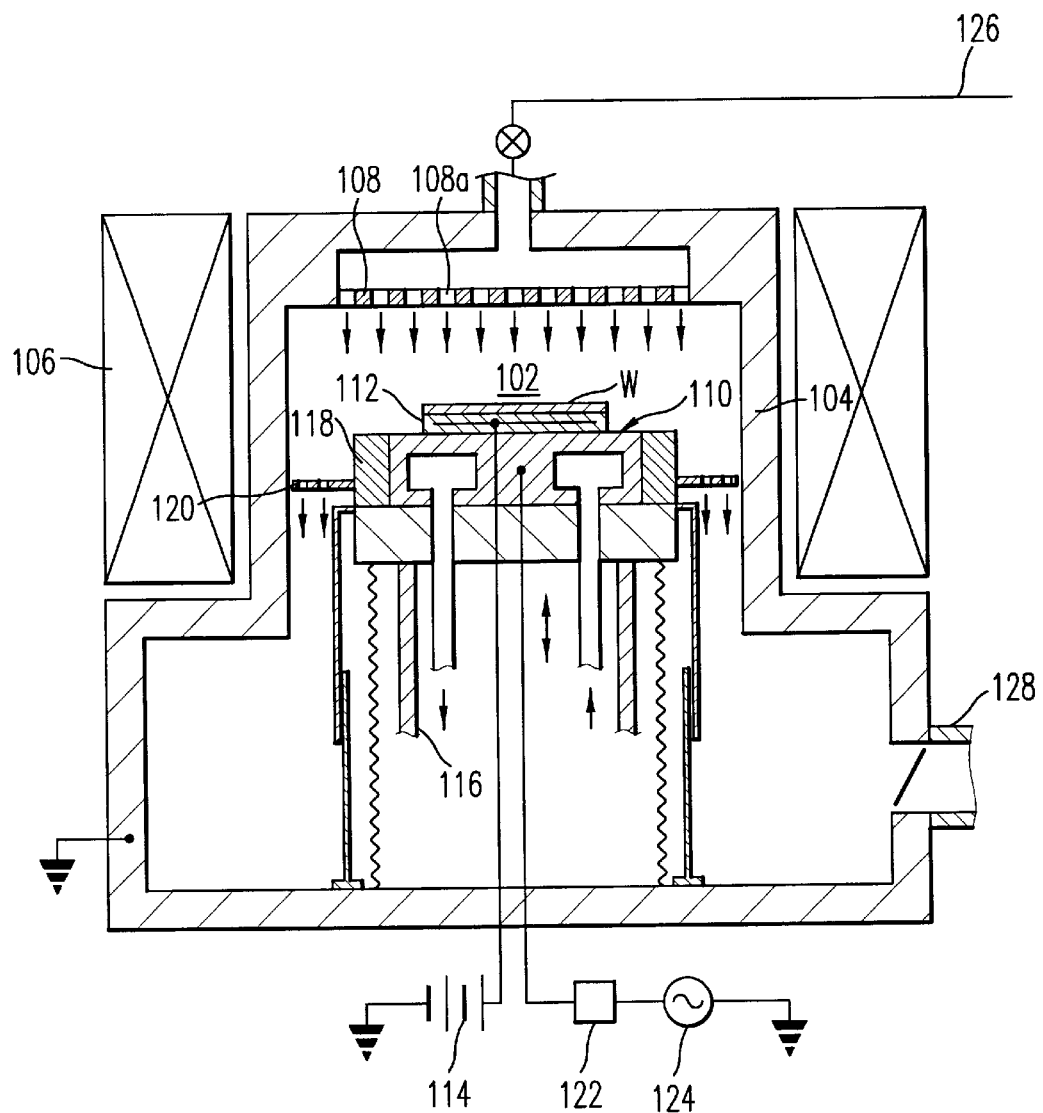
FIG. 1 is a schematic illustration of one embodiment of a gas plasma processing system.

Turning now to the drawings in which like reference numerals designate identical or corresponding parts throughout the several views, FIG. 1 is a schematic illustration of one embodiment of the present invention. In this embodiment, the treatment chamber (102) of the etching device (100) is formed within the hermetic and electroconductive treatment container (104). Magnets (106), which are capable of forming a rotating magnetic field in a plasma region formed within the treatment chamber (102), surround the treatment container (104). The upper electrode (108), which constitutes the ceiling of the treatment chamber (102), and the electroconductive lower electrode (110), opposite the upper electrode (108) and which constitutes a susceptor; are formed within the treatment chamber (102).

The electrostatic chuck (112), to which the high-voltage DC power source (114) is connected, is configured above the lower electrode (110). A treatment object, such as the semiconductor wafer (hereafter referred to simply as the "wafer") (W), can be fixed via suction to the mounting plane above this electrostatic chuck (112). A lift mechanism (not shown in the figure) is connected to the lower electrode (110) via the lift axle (116), and the lower electrode (110) can freely ascend and descend. The focus ring (118) is positioned to cover the profile plane of the lower electrode (110). The baffle panel (120), on which multiple through holes have been formed, is attached to the profile plane of the focus ring (118). The high-frequency power source (124), which is capable of outputting a certain high-frequency electrical power for forming a plasma, is connected to the lower electrode (110).

Multiple through holes (108a), which connect the interior of the treatment chamber (102) with the gas feeding source (126) are formed on the upper electrode (108) creating a "shower head" shape. Based on such a structure, the treatment gas employed in the present embodiment (e.g., mixed gas including $C_5F_8$, $O_2$, and a carrier gas) is homogeneously ejected in the wafer (W) direction within the treatment chamber (102) from the gas feeding source (126) via the through holes (108a). The treatment gas, however, is not limited to the aforementioned mixed gas including $C_5F_8$, $O_2$, and the carrier gas, and depending on the types of wafers (W) and treatment conditions, it is possible to use (1) $C_5F_8$ alone or (2) a gas mixture including $C_5F_8$ and at least one of $O_2$ and CO. In the present invention, high purity $C_5F_8$, in the form of octafluro-cyclopentene from Nippon Zeon Co., Ltd. is used. It is also possible to add carrier gases which do not react with the substrate being processed; the carrier gases including Ne, Kr, Xe, He, Ar, $N_2$, etc. The functions and effects of varying gases is explained using several examples below.

The atmosphere within the treatment chamber (102) is discharged from the gas exhaustion tube (128) via the baffle panel (120). The atmospheric pressure within the treatment chamber (102) is selected depending on the rate at which the aforementioned treatment gas is fed into the treatment chamber (102) and the atmosphere discharge level within the treatment chamber (102).

Figure 2:
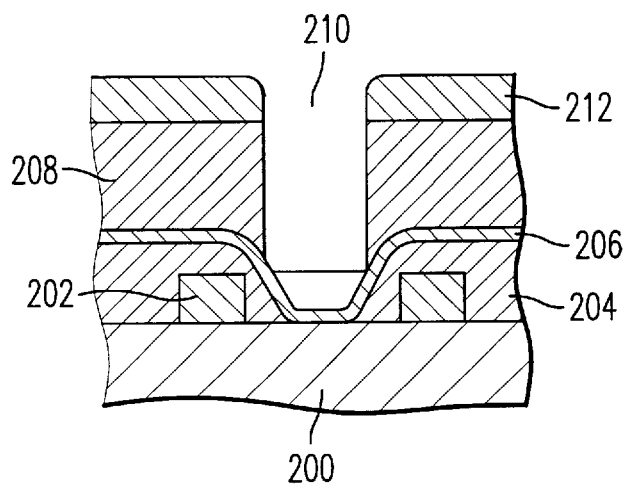
FIG. 2 is a schematic illustration showing an approximate magnified cross-sectional view of a wafer which is treated by using the gas plasma processing system shown in FIG. 1.

A process for etching a contact hole in the wafer (W) by using the etching device (100) according to the present invention is explained with reference to FIG. 2. First, the gates (202) are formed above the Si (silicon) substrate (200) (e.g., the wafer (W)), and the insulating layer (204) is formed to cover the gates (202). The $Si_3N_4$ film (silicon nitride) (206) covers the surface of the insulating layer (204). This $Si_3N_4$ film (206) prevents the etching of the gates (202) during the formation of the contact hole (210), and forms the contact hole (210) between the gates (202) in a self-aligning fashion. A silicon oxide film acts as an insulating layer is formed above the $Si_3N_4$ film (206). The insulating layer (204) and $SiO_2$ film (208) may also be constituted by BPSG, PSG, TEOS (tetraethoxy-o-silane), Th-OX (thermal oxide), SOG (spun-on glass), etc.

An oxide is formed over the wafer to isolate one layer from the next layer. A photoresist is then applied (e.g., using spin coating) after optionally having applied an anti-reflective coating. Non-limiting examples of suitable techniques for applying a photoresist will include spraying, roller coating and spin coating. Examples of preferred resist materials include "Deep UV" for use with anti-reflective coatings and "I-line" for use without an anti-reflective coating. The thickness of the photoresist material may vary depending upon the application. However, according to the invention, a thinner photoresist layer can be used in light of the high selectively of the $C_5F_8$. The photoresist is then developed to remove a corresponding portion of the photoresist, leaving behind the pattern of holes to be etched.

After patterning and developing, hard baking of the resist may be conducted by conventional methods known to those of ordinary skill in the art. Hard baking is typically performed to prevent photoresist lifting from the underlying dielectric layer during wet etching, for example, by baking at about 120–130° C. It may be required to re-expose portions of the oxide layer after baking using a breakthrough or "descum" procedure which typically utilizes either Ar and $O_2$ or $CHF_3$ and $SO_2$.

To form a contact hole, the wafer (W) first is mounted above the lower electrode (110), and the treatment gas of the present application embodiment (e.g., a mixed gas including $C_{5F8}$, $O_2$, and Ar) is introduced into the treatment chamber (102) while vacuum suction is applied to maintain a certain reduced atmospheric pressure (e.g., 40 (mTorr)) within the treatment chamber (102). Moreover, the magnets (106) are rotated to form a rotating magnetic field in the plasma region within the treatment chamber (102). Next, after certain process conditions have been established, a high-frequency electrical power with a certain magnitude (e.g., 1,500 (W)) is applied on the lower electrode (110) from the high-frequency power source (124) at a certain frequency (e.g., 13.56 (MHZ)), and a glow discharge is induced between it and the upper electrode (108). As a result, the treatment gas of the present application embodiment, which has been fed into the treatment chamber (102), is dissociated, and a high-density plasma is excited.

Since the treatment gas of the present application embodiment is a mixed gas including $C_5F_8$, $O_2$, and a carrier gas, it is capable of creating a carbon-rich atmosphere within the treatment chamber (102) without adding CO, and a carbon layer which serves as a protective layer can be assuredly formed on the inner wall surface of the contact hole. (In an alternate embodiment described below, CO is added.) As a result, the arrival of fluorine radicals (i.e., etching ions) at the silicon nitride film (206) is inhibited, and since the $SiN_x$ film (206) can be protected, the selection ratio between the $SiN_x$ film (206) and the $SiO_2$ film (208) can be improved. As FIG. 2 indicates, the contact hole (210) can be formed in the narrow space between the gates (202) to have an objective homogeneous shape. The photoresist (212), which serves as a mask for the contact hole (210), is formed above the $SiO_2$ film (208).

Based on the foregoing structure of the present application embodiment, an etching process is performed by using a gas mixture which includes $C_5F_8$, which can be decomposed within a relatively brief period in the atmosphere, during the formation of the contact hole (210). Accordingly, any $C_5F_8$ not decomposed during the treatment, and even any $C_5F_8$ accidentally released directly into the atmosphere, contributes less to greenhouse effects than previous $C_xF_y$ gases.

In the following application examples of the use of $C_5F_8$, the etching device (100) is used to form a contact hole (210) between the gates (202) which have been formed on the wafer (W). By changing various conditions, such as the treatment gas composition, the gas flow rate, etc., various differences in a resulting etch are obtained.

Figure 3A:
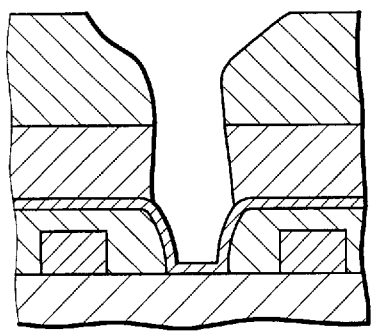
FIGS. 3A and 3B are schematic illustrations showing approximate etches provided at a middle and an edge of a wafer, respectively, when etching occurs in the gas plasma processing system shown in FIG. 1 in the presence of $C_5F_8$/CO/Ar in quantities of 6/300/380 sccm.
Figure 3B:
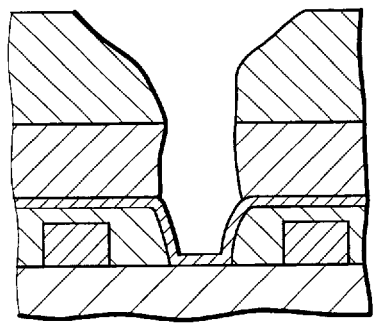

As shown in FIGS. 3A and 3B, a gas mixture of $C_5F_8$ and CO is used to etch a substrate. The atmospheric pressure within the treatment chamber (102) was selected as 40 (mTorr), and the temperatures of the upper electrode (108) and the inner wall surface of the treatment chamber (102) were maintained at 60 (° C.), whereas the temperature of the lower electrode (110) was maintained at 40 (° C.). A high-frequency electrical power of 1,500 (W) was applied on the lower electrode (110) at a frequency of 13.56 (MHZ). A chamber with a diameter of 200 (mm) was used with a wafer (W). A treatment was performed by using an etching device (100) equipped with a treatment chamber (102) with a content volume of 38 (L).

FIGS. 3A through 6B show the homogeneities within the treatment surface plane of the wafer (W) (hereafter referred to simply as the "intraplane homogeneity") at variable treatment gas flow rates. The approximate corresponding shapes of the wafers (W) are also shown. Further, the selection ratios of $SiO_2$ with respect to $SiN_x$ were calculated for each of the rates. The intraplane homogeneity is inversely proportional to the deviation between the average etching rates of the middle and edge of the wafer (W) versus the average etching rate (%). As the absolute value of the deviation increases, the homogeneity decreases, whereas as it decreases, the homogeneity increases. The selection ratio of $SiO_2$ with respect to $SiN_x$ is the average of the ($SiO_2$ etching rate)/($SiN_x$ etching rate) values of the middle and edge of the wafer (W) in a state where the $SiN_x$ film (206) is exposed during etching of the $SiO_2$ film (208).

In a first example corresponding to FIGS. 3A and 3B, the flow rates of the treatment gas combinations were established as: $C_5F_8$/CO/Ar=6/300/380 (sccm), and an etch was performed under conditions otherwise identical to the aforementioned ones. As a result, the etching rate of $SiO_2$ at the middle of the wafer (W) was 3,200 (Å/min.), and the corresponding rate at the edge was also 3,200 (Å/min.). The intraplane homogeneity of the wafer (W) was ±0(%), and the selection ratio of $SiO_2$ with respect to $SiN_x$ was 9.6.

Figure 4A:
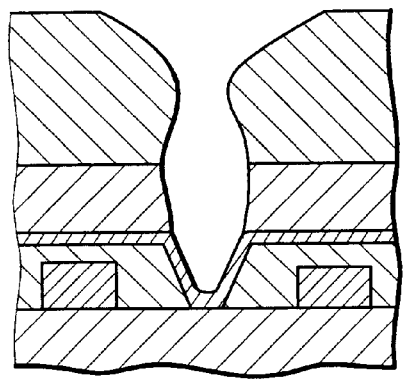
FIGS. 4A and 4B are schematic illustrations showing approximate etches provided at a middle and an edge of a wafer, respectively, when etching occurs in the gas plasma processing system shown in FIG. 1 in the presence of $C_5F_8$/CO/Ar in quantities of 9/300/380 sccm.
Figure 4B:
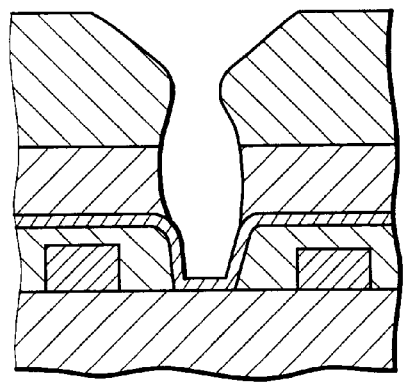

In a second example corresponding to FIGS. 4A and 4B, the flow rate of $C_5F_8$ was changed from 6 sccm to 9 sccm to provide flow rates of: $C_5F_8$/CO/Ar=9/300/380 (sccm), and an etch was performed under the other previously described conditions. As a result, the etching rate of $SiO_2$ at the middle of the wafer (W) was 3,600 (Å/min.), and the corresponding rate at the edge was 4,100 (Å/min.). The intraplane homogeneity of the wafer (W) was ±6.5(%), and the selection ratio of $SiO_2$ with respect to $SiN_x$ was 23.1.

Figure 5A:
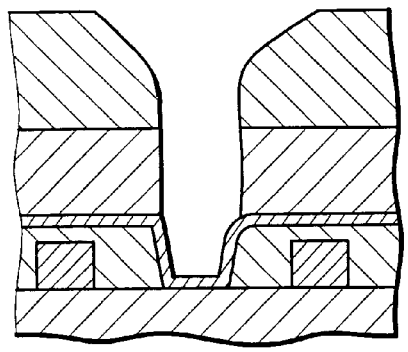
FIGS. 5A and 5B are schematic illustrations showing approximate etches provided at a middle and an edge of a wafer, respectively, when etching occurs in the gas plasma processing system shown in FIG. 1 in the presence of $C_5F_8$/CO/Ar in quantities of 6/150/380 sccm.
Figure 5B:
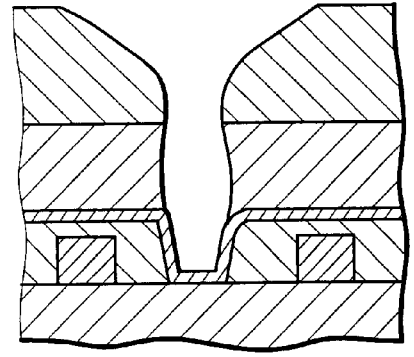

In a third example corresponding to FIGS. 5A and 5B, the flow rates of the treatment gas combinations were established as: $C_5F_8$/CO/Ar 6/150/380 (sccm), and an etch was performed under conditions otherwise identical to the aforementioned ones. As a result, the etching rate of $SiO_2$ at the middle of the wafer (W) was 3,700 (Å/min.), and the corresponding rate at the edge was 4,100 (Å/min.). The intraplane homogeneity of the wafer (W) was ±5.1(%), and the selection ratio of $SiO_2$ with respect to $SiN_x$ was 11.4.

Figure 6A:
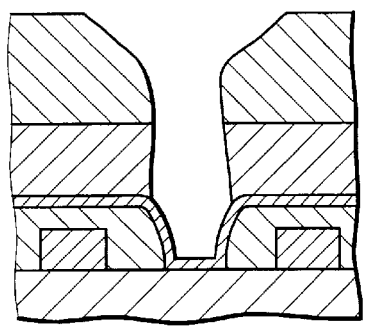
FIGS. 6A and 6B are schematic illustrations showing approximate etches provided at a middle and an edge of a wafer, respectively, when etching occurs in the gas plasma processing system shown in FIG. 1 in the presence of $C_3F_8$/CO/Ar in quantities of 6/150/600 sccm.
Figure 6B:
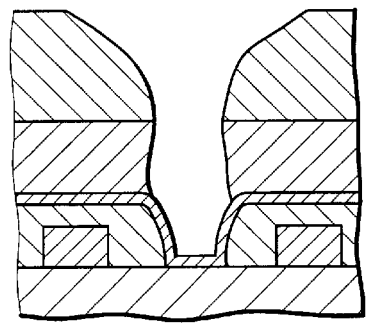

In a fourth example corresponding to FIGS. 6A and 6B, the flow rates of the treatment gas combinations were established as $C_5F_8$/CO/Ar=6/150/600 (sccm), and an etch was performed under conditions otherwise identical to the aforementioned ones. As a result, the etching rate of $SiO_2$ at the middle of the wafer (W) was 3,300 (Å/min.), and the corresponding rate at the edge was 3,500 (Å/min.). The intrap lane homogeneity of the wafer (W) was±2.9(%), and the selection ratio of $SiO_2$ with respect to $SiN_x$ was 12.0.

Thus, when $SiO_2$ was selectively etched in relation to $SiN_x$ by using a mixed gas of $C_5F_8$, CO, and Ar and where the flow rates of the respective components of the mixed gases were varied according to the conditions of the aforementioned first through fourth examples, the etching rates ranged from 3,200 (Å/min.) to 4,100 (Å/min.), whereas the intraplane homogeneities ranged from 0(%) to ±6.5(%), and the selection ratios of $SiO_2$ with respect to $SiN_2$ ranged from 9.6 to 23.1. Thus, contact holes with homogeneous shapes can be formed by varying the flow rates of the respective constituent gases of the treatment gases, as described in the above examples.

In an alternate embodiment of the present invention, a mixture of $C_5F_8$ and $O_2$ is described. In the following fifth through tenth examples, which respectively correspond to FIGS. 7A through 12B, the designated conditions other than the treatment gases and the flow rates of the treatment gases were identical to those in the aforementioned first through fourth examples, in which a mixture of $C_5F_8$ and CO was used. In the tenth example corresponding only to FIG. 12, the atmospheric pressure within the treatment chamber (102) was changed from 40 mTorr to 30 mTorr. In the fifth through tenth examples, the intraplane homogeneities of the wafers (W) and the selection ratios of $SiO_2$ with respect to $SiN_x$ were respectively computed according to procedures identical to those in the aforementioned first through fourth application examples, and the approximate etched shapes of the wafers (W) are shown.

Figure 7A:
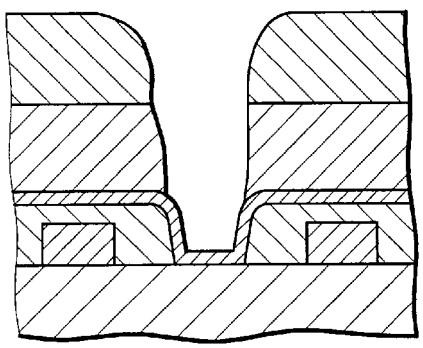
FIGS. 7A and 7B are schematic illustrations showing approximate etches provided at a middle and an edge of a wafer, respectively, when etching occurs in the gas plasma processing system shown in FIG. 1 in the presence of $C_3F_8/O_2$/Ar in quantities of 6/4/380 sccm.
Figure 7B:
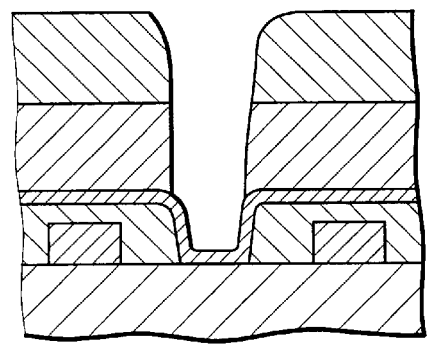

In a fifth example corresponding to FIGS. 7A and 7B, the flow rates of the treatment gas combinations were established as $C_5F_8$/$O_2$/Ar=6/4/380 (sccm), and an etch was performed under conditions otherwise identical to those in the aforementioned first through fourth examples. As a result, the etching rate of $SiO_2$ at the middle of the wafer (W) was 4,500 (Å/min.), and the corresponding rate at the edge was 5,200 (Å/min.). The intraplane homogeneity of the wafer (W) was ±7.2(%), and the selection ratio of $SiO_2$ with respect to $SiN_x$ was 16.8.

Figure 8A:
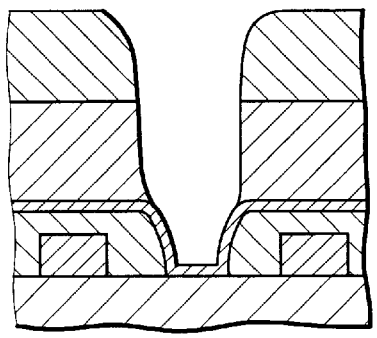
FIGS. 8A and 8B are schematic illustrations showing approximate etches provided at a middle and an edge of a wafer, respectively, when etching occurs in the gas plasma processing system shown in FIG. 1 in the presence of $C_3F_8/O_2$/Ar in quantities of 6/6/380 sccm.
Figure 8B:
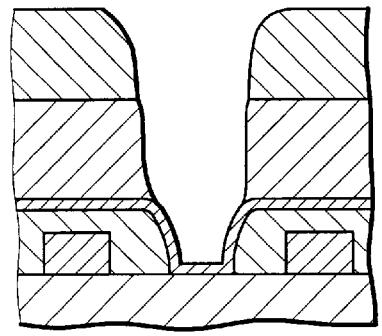

In a sixth example corresponding to FIGS. 8A and 8B, the flow rates of the treatment gas combinations were established as $C_5F_8$/$O_2$/Ar=6/6/3 80 (sccm), and an etch was performed under conditions otherwise identical to those in the aforementioned fifth example. In other words, only the flow rate of $O_2$ was changed from the 4 (sccm) in the aforementioned fifth example to 6 (sccm) in the present example. As a result, the etching rate of $SiO_2$ at the middle of the wafer (W) was 4,700 (Å/min.), and the corresponding rate at the edge was also 4,700 (Å/min.). The intraplane homogeneity of the wafer (W) was ±0(%), and the selection ratio of $SiO_2$ with respect to $SiN_x$ was 13.3.

Figure 9A:
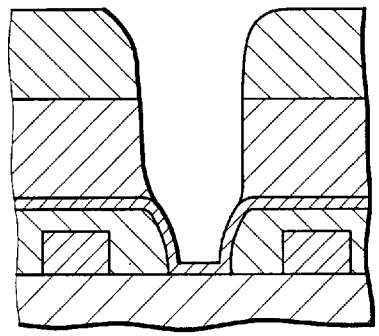
FIGS. 9A and 9B are schematic illustrations showing approximate etches provided at a middle and an edge of a wafer, respectively, when etching occurs in the gas plasma processing system shown in FIG. 1 in the presence of $C_3F_8/O_2$/Ar in quantities of 6/4/600 sccm.
Figure 9B:
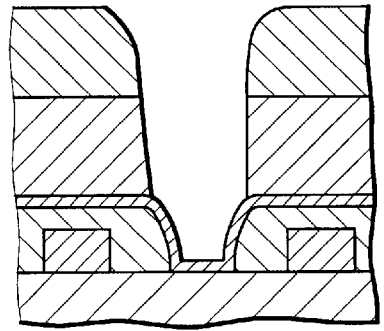

In a seventh example corresponding to FIGS. 9A and 9B, the flow rates of the treatment gas combinations were established as $C_5F_8$/$O_2$/Ar=6/4/600 (sccm), and an etch was performed under conditions otherwise identical to those in the aforementioned fifth example. In other words, only the flow rate of Ar was changed from the 380 (sccm) in the aforementioned fifth example to 600 (sccm) in the present example. As a result, the etching rate of $SiO_2$ at the middle of the wafer (W) was 3,900 (Åmin.), and the corresponding rate at the edge was 4,200 (Å/min.). The intraplane homogeneity of the wafer (W) was ±3.7(%), and the selection ratio of $SiO_2$ with respect to $SiN_x$ was 14.7.

Figure 10A:
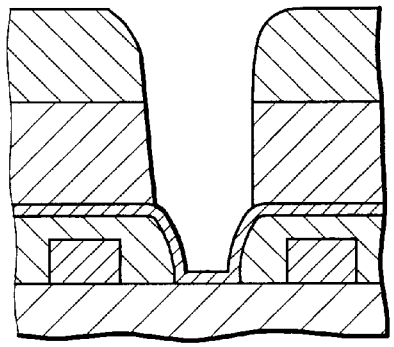
FIGS. 10A and 10B are schematic illustrations showing approximate etches provided at a middle and an edge of a wafer, respectively, when etching occurs in the gas plasma processing system shown in FIG. 1 in the presence of $C_3F_8/O_2$/Ar in quantities of 3/2/190 sccm.
Figure 10B:
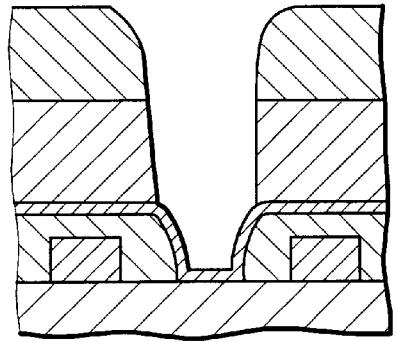

In an eighth example corresponding to FIGS. 10A and 10B, the flow rates of the treatment gas combinations were established as $C_5F_8$/$O_2$/Ar=3/2/190 (sccm), and an etch was performed under conditions otherwise identical to those in the aforementioned fifth example. In other words, the respective flow rates of $C_5F_8$, $O_2$, and Ar were reduced in half in the present example in comparison with the flow rates of $C_5F_8$, $O_2$, and Ar in the aforementioned fifth example. As a result, the etching rate of $SiO_2$ at the middle of the wafer (W) was 4,000 (Å/min.), and the corresponding rate at the edge was 3,900 (Å/min.). The intraplane homogeneity of the wafer (W) was ±1.3(%), and the selection ratio of $SiO_2$ with respect to $SiN_x$ was 10.8.

Figure 11A:
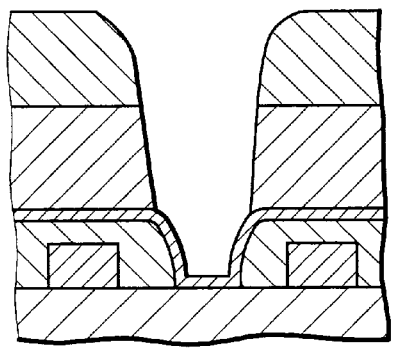
FIGS. 11A and 11B are schematic illustrations showing approximate etches provided at a middle and an edge of a wafer, respectively, when etching occurs in the gas plasma processing system shown in FIG. 1 in the presence of $C_3F_8/O_2$/Ar in quantities of 12/8/760 sccm.
Figure 11B:
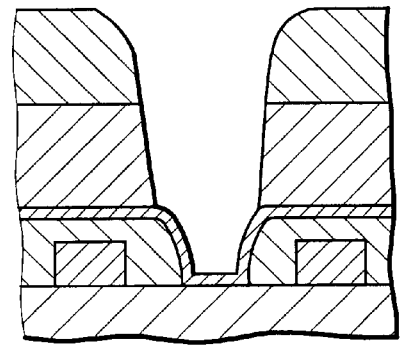

In a ninth example corresponding to FIGS. 11A and 11B, the flow rates of the treatment gas combinations were established as $C_5F_8/O_2/Ar=12/8/760$ (sccm), and an etch was performed under conditions otherwise identical to those in the aforementioned fifth example. In other words, the respective flow rates of $C_5F_8$, $O_2$, and Ar were doubled in the present example in comparison with the flow rates of $C_5F_8$, $O_2$, and Ar in the aforementioned fifth example. As a result, the etching rate of $SiO_2$ at the middle of the wafer (W) was 4,200 (Å/min.), and the corresponding rate at the edge was also 4,200 (Å/min.). The intraplane homogeneity of the wafer (W) was ±0(%), and the selection ratio of $SiO_2$ with respect to $SiN_x$ was 12.3.

Figure 12A:
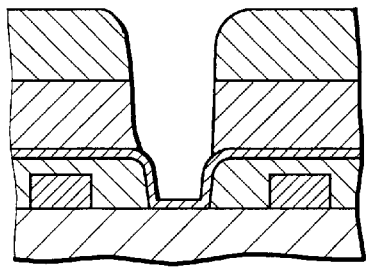
FIGS. 12A and 12B are schematic illustrations showing approximate etches provided at a middle and an edge of a wafer, respectively, when etching occurs in the gas plasma processing system shown in FIG. 1 in the presence of $C_3F_8/O_2$/Ar in quantities of 6/4/380 sccm at a chamber pressure of 30 mTorr.
Figure 12B:
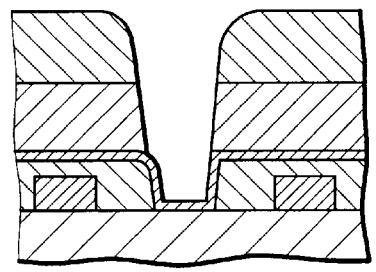

In a tenth example corresponding to FIGS. 12A and 12B, the atmospheric pressure within the treatment chamber (102) was lowered to 30 (mTorr), and an etch was performed under conditions otherwise identical to those in the aforementioned fifth example. In other words, the flow rate of the treatment gas was designated at $C_5F_8/O_2/Ar=6/4/380$ (sccm), as in the aforementioned fifth example, and only the atmospheric pressure within the treatment chamber (102) was changed from the 40 (mTorr) in the aforementioned fifth example to 30 (mTorr). As a result, the etching rate of $SiO_2$ at the middle of the wafer (W) was 4,400 (Å/min.), and the corresponding rate at the edge was 4,500 (Å/min.). The intraplane homogeneity of the wafer (W) was ±1.1(%), and the selection ratio of $SiO_2$ with respect to $SiN_x$ was 13.1.

Thus, in cases where the flow rates of the respective components of a mixed gas of $C_5F_8$, $O_2$, and Ar were varied according to the conditions of the aforementioned fifth through ninth examples, and when the atmospheric pressure within the treatment chamber (102) was varied according to the conditions of the aforementioned tenth example during the selective etching of $SiO_2$ in relation to $SiN_x$ by using said mixed gas, the etching rates ranged from 3,900 (Å/min.) to 5,200 (Å/min.), whereas the intraplane homogeneities ranged from 0(%) to ±7.2(%), and the selection ratios of $SiO_2$ with respect to $SiN_x$ ranged from 10.8 to 16.8. Thus, contact holes with homogeneous shapes can be formed by varying the flow rates of the respective constituent gases as in the fifth through tenth examples above.

In another alternate embodiment, a contact hole is formed on the wafer (W) more effectively and efficiently by etching an $SiO_2$ film by using a mixed gas of CO and $C_4F_8$ (the etching rate of which versus the $SiO_2$ film is higher than that of $C_5F_8$) until the $SiN_x$ film formed above the wafer (W) is exposed, then subsequently by etching the $SiO_2$ film by switching to a mixed gas of $O_2$, Ar, and $C_5F_8$, which yields an $SiO_2$ film selection ratio versus the $SiN_x$ film higher than that of $C_4F_8$, or to a mixed gas of $C_5F_8$, CO, and Ar after said $SiN_x$ film has been exposed.

Figure 13A:
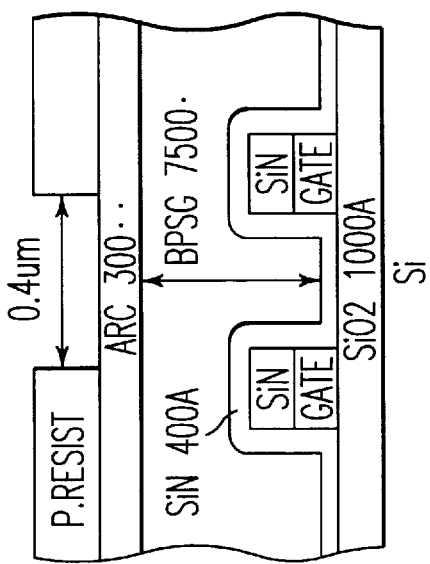
FIGS. 13A and 13B are schematic illustrations of an approximately ideal self-aligning contact on a partially processed semiconductor wafer having an anti-reflective coating before and after processing, respectively, according to the present invention.

In an alternate embodiment, a mixture of gases is used to etch a portion of a partially exposed wafer, e.g., to expose a self-aligning contact such as shown in FIG. 13A. An uppermost photoresist layer has been applied on top of a 900 Å anti-reflective coating (ARC), which helps to ensure good patterning during the photolithography step. The layer shown has been partially stripped during development to expose a 0.4 μm hole above a portion of the wafer to be processed. The exposed portion to be etched includes a 7500 Å BPSG dielectric layer which is formed on top of a 400 Å SiN layer that acts as an etch stop. As would be evident to one of ordinary skill in the art, other dielectric layers and other etch stops are also possible. Generally, the etch stops described herein will be referred to as silicon nitride layers, but the invention is applicable to any $Si_xN_y$ layer. A preferred dielectric layer includes $SiO_2$ or $SiO_2$ doped with boron (B) and/or phosphorous (P). In another embodiment, the dielectric material is a TEOS layer doped with boron (B) and/or phosphorous (P) to form BTEOS, PTEOS, or BPTEOS. When the dielectric material is BPTEOS, the dielectric layer may further comprise a capping layer prepared from TEOS, which can act to stabilize the BPTEOS layer during processing and/or prevent etching and/or migration of dopants from the BPTEOS layer into a subsequently deposited layer. When present, a capping layer may be etched in a first stage, under optimum etching conditions which are not necessarily the optimum etching conditions for the underlying BPTEOS layer. After the capping layer has been etched, the underlying BPTEOS layer may be etched according to the method described herein.

The etching process according to the present invention is more properly characterized as a "depth etching" step rather than a chemical processing step because $C_5F_8$ does not always react with oxides or silicon nitride to etch these layers. Instead, the amount of $C_5F_8$ and other gases adjusts a balance between a sputter/etch rate and a deposition rate of a protective polymer that is produced in the presence of carbon and fluorine. An increase in the amount of $O_2$ decreases the deposition rate of the polymer and reduces the selectivity of the $C_5F_8$. However, if too little $O_2$ is provided, the deposition rate of the polymer is increased so substantially that the deposition prevents etching (almost) completely. The present invention, therefore, seeks to maintain a high selectivity by limiting the amount of $O_2$, but without reducing the $O_2$ concentration to the point that an overly aggressive polymer deposition process is created.

Figure 13B:
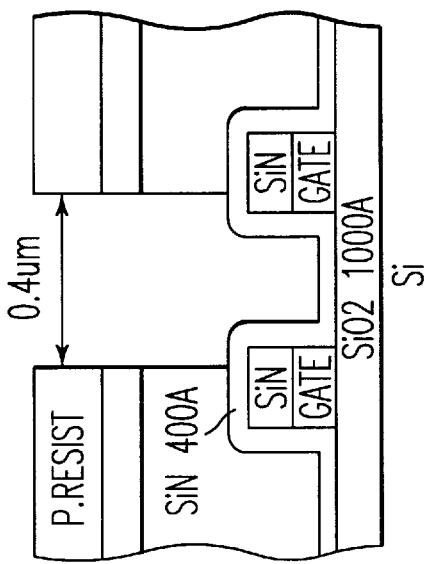

As seen in FIG. 13B, when the gas mixture is properly balanced, the etch process stops at the etch stop without damaging the oxide layer underneath. This high selectivity is especially important when this silicon nitride layer is a plasma enhanced nitride layer which is softer than other silicon nitride layers grown in a furnace with silane and nitrogen. In order to protect the shoulders of the 400 Å SiN layer from being etched away, the present invention utilizes a mixture of $C_5F_8$ in combination with a carrier gas and at least one of CO and $O_2$. It is preferred that the $C_5F_8$ gas be of very high purity—in the range of greater than 97% pure and preferably at least 99% pure. The gases are to be mixed such that the flow rates (measured in standard cubic centimeters per minute (sccm)) are in the ranges of: $C_5F_8$:7–15; CO: 0–100; carrier gas: 500; and $O_2$: 0–6. It is believed that the addition of CO provides an additional amount of free carbons that increase the polymer deposition rate. Too little CO reduces the selectivity of the $C_5F_8$ and increases the etch rate. However, when too much CO is present, too much polymer is produced. To restore the balance between the etch rates of oxide and silicon nitride, $O_2$ can be added to the process to reduce the rate of production of the polymer, thereby increasing the etch rate of the oxide (as can be seen by comparing runs #7 and #8 in FIG. 17A). Using the combination of $C_5F_8$, CO, $O_2$, and a carrier gas creates a quasi-equilibrium in which sputtering and etching occur simultaneously. As seen for run #6 in FIGS. 6A and 6B, using rates of 9, 50, 500, and 3, respectively, for $C_5F_8$, CO, Ar and $O_2$, provides a reasonably fast etch rate for oxide (3235 Å/min at maximum) and a relatively low etch rate for SiN (29 Å/min at max and only 13 Å/min on average). On average, the oxide is etched twenty times faster than the SiN. This provides the desired selectivity in which the oxide is etched but the SiN layer is left, relatively, less etched or unetched.

After the etch step, a polymer removal step may be required to remove the polymer deposited in the presence of the $C_5F_8$ gas mixture. The polymer is believed to be a strong carbon-based polymer and can be removed with $O_2$. As can further be seen in FIG. 13B, the shoulder or corner of the silicon nitride layer above the poly layer continues to protect the poly layer even though the oxide in the middle of the opening is etched to below the level of the top of the silicon nitride.

Figure 14A:
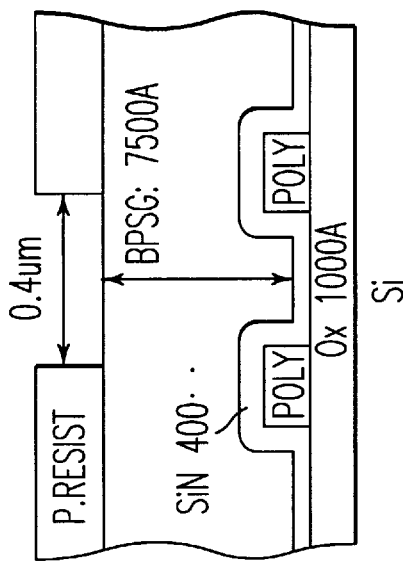
FIGS. 14A and 14B are schematic illustrations of an approximately ideal self-aligning contact on a partially processed semiconductor wafer without an anti-reflective coating before and after processing, respectively, according to the present invention.
Figure 14B:
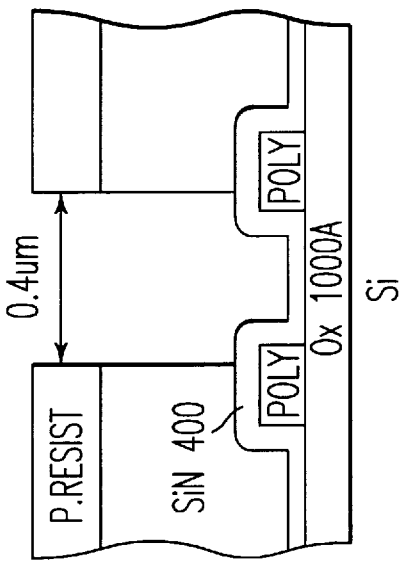
Figure 15A:
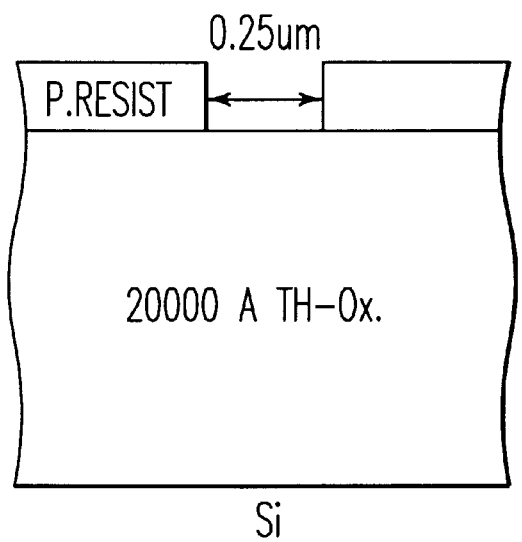
FIGS. 15A and 15B are schematic illustrations of an approximately ideal contact on a partially processed semiconductor wafer before and after processing, respectively, according to the present invention.
Figure 15B:
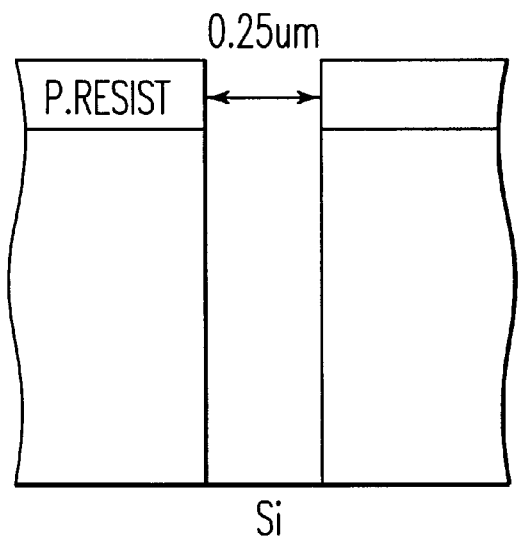
Figure 16A:
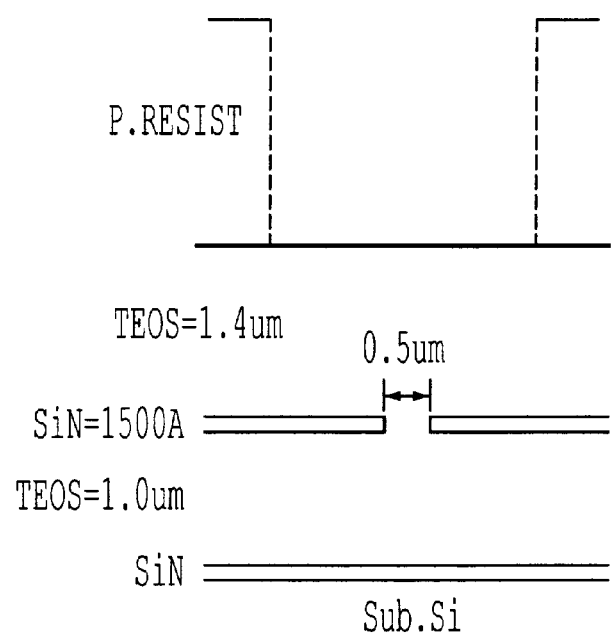
FIGS. 16A and 16B are schematic illustrations of an approximately ideal dual damascene structure on a partially processed semiconductor wafer before and after processing, respectively, according to the present invention.
Figure 16B:
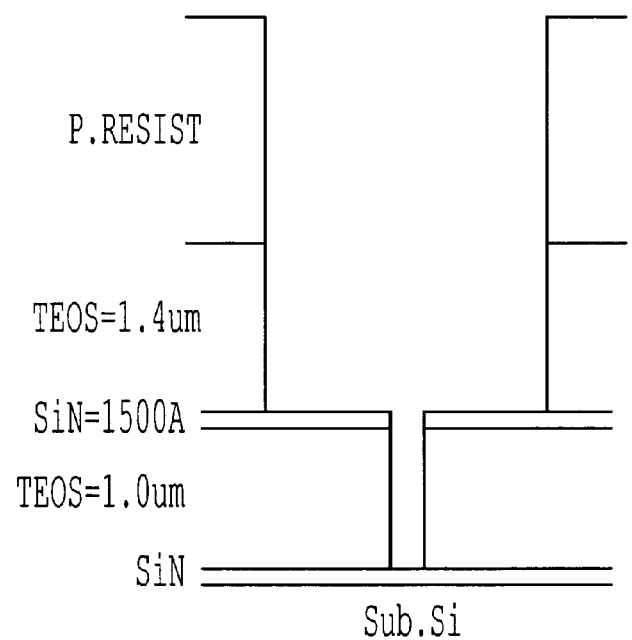

In FIG. 14A, another circuit structure is used to etch a 7500 Å BPSG layer, as in FIG. 13A, but without the help of an anti-reflective coating layer underneath. As shown in FIG. 14B, the etch process again is stopped at the 400 Å SiN layer. The process, however, is not limited to the etching of BPSG. A thick oxide alone can be etched to provide a contact hole above a bare silicon substrate. FIGS. 15A and 15B show such an oxide layer before and after etch. FIGS. 16A and 16B show two different size holes being etched with SiN acting as a barrier to etching of the 1.0 urn TEOS layer. The sidewalls are not necessarily straight and tend to be shaped similarly to the photoresist above the opening.

Figure 18A:
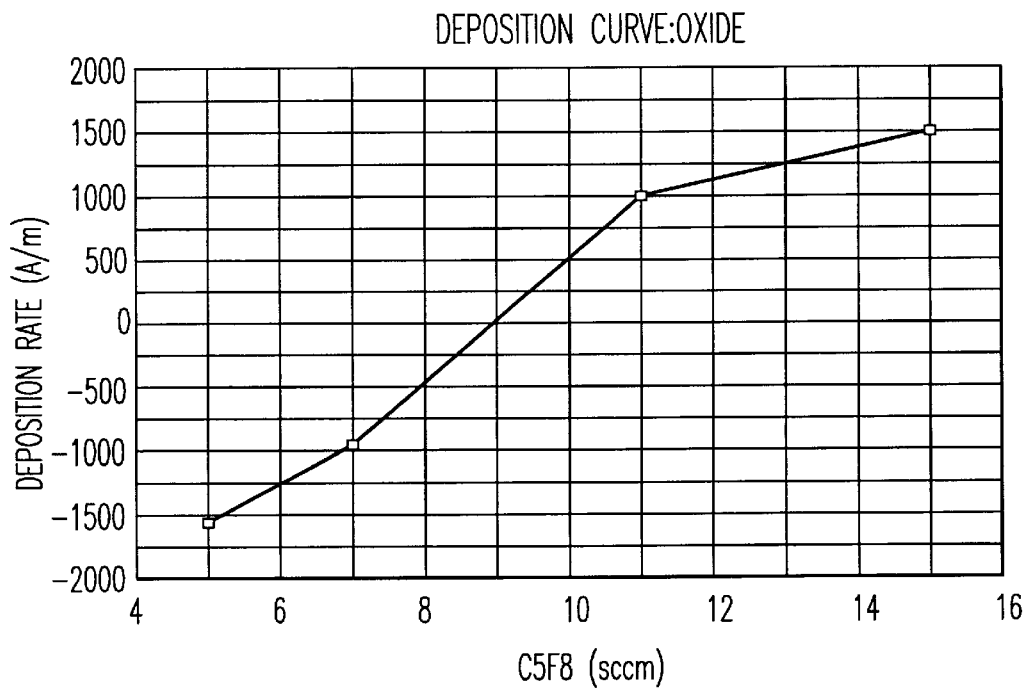
FIGS. 18A and 18B are graphs showing deposition rates for oxide and nitride, respectively, on a blank wafer as a function of flow rate of $C_5F_8$ when the flow rates of CO and $O_2$ were 100 sccm and 0 sccm, respectively.
Figure 18B:
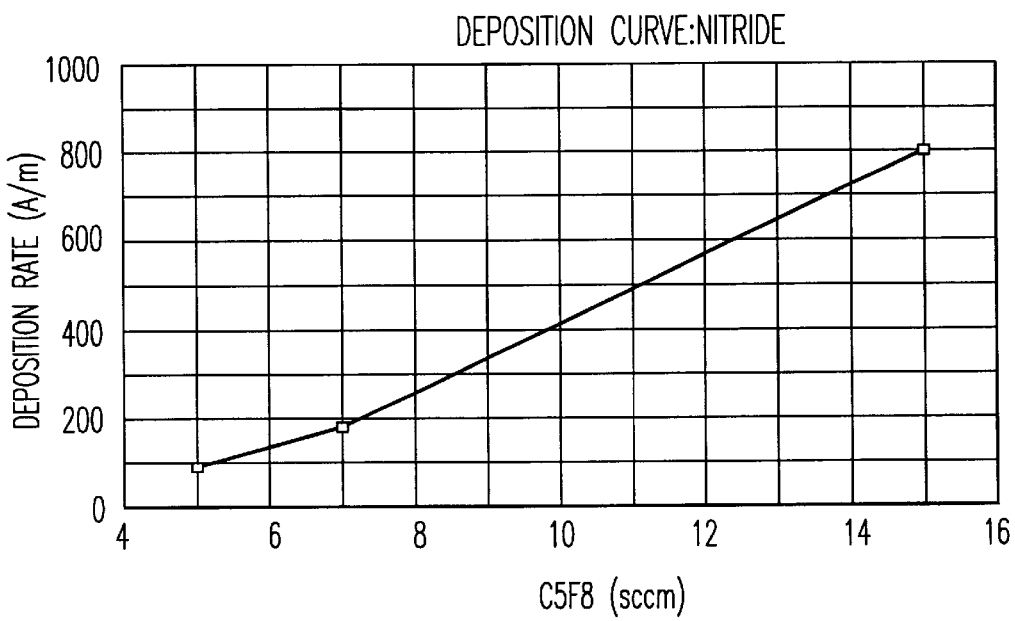
Figure 19A:
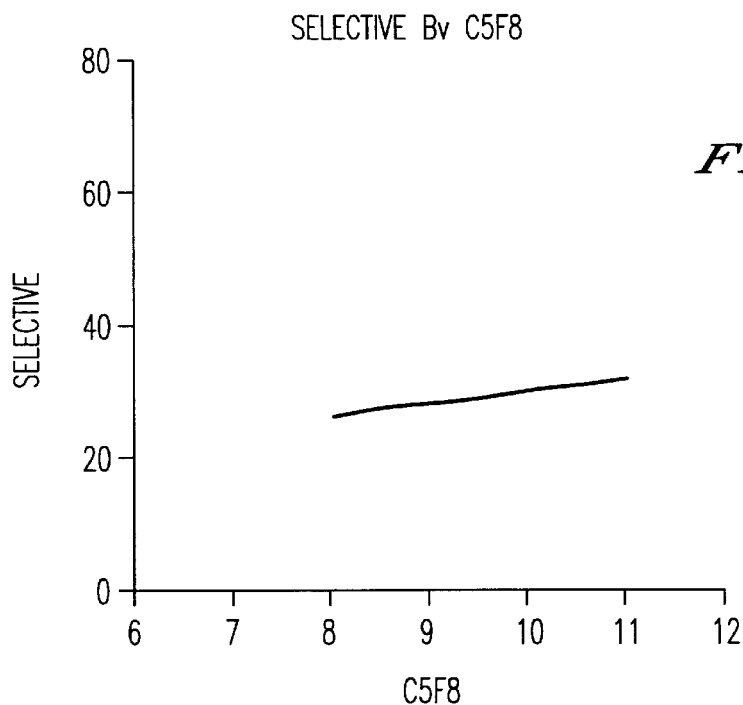
FIGS. 19A–19E are graphs of approximated linear fits of selectivity, etching rate of an oxide layer, uniformity of a resulting oxide layer, uniformity of a nitride layer, and etching of a nitride layer, respectively.
Figure 19B:
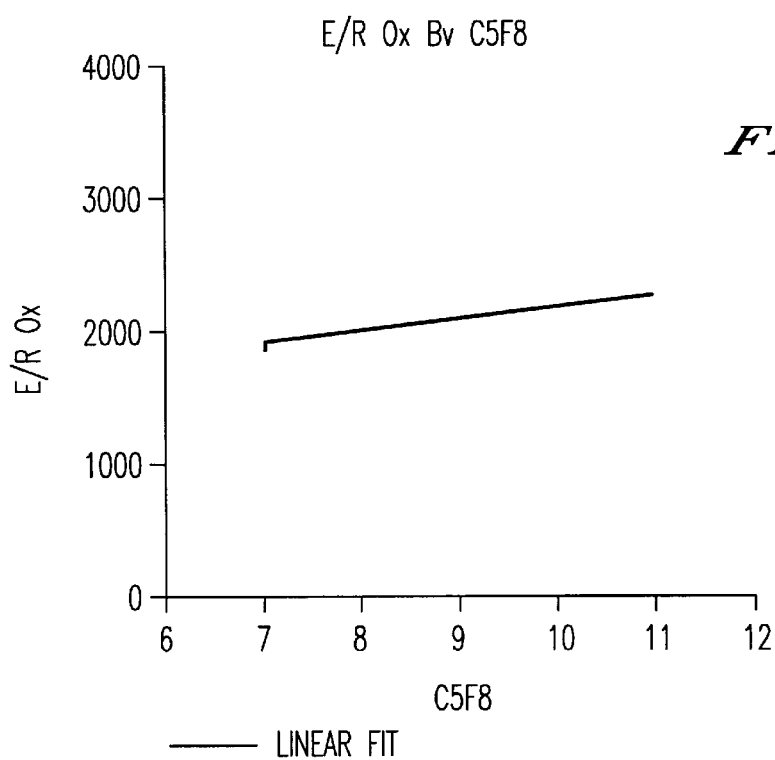
Figure 19C:
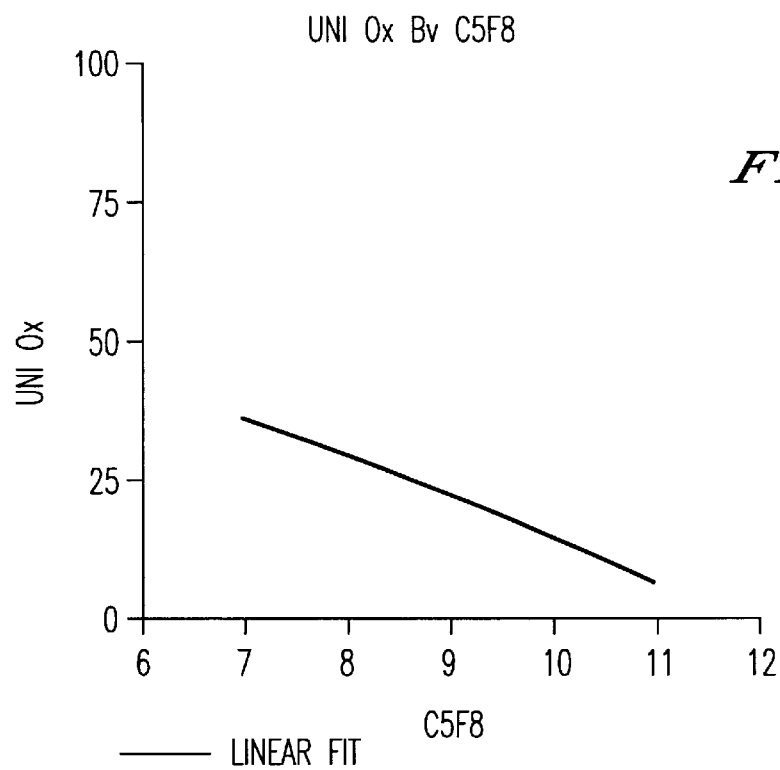
Figure 19D:
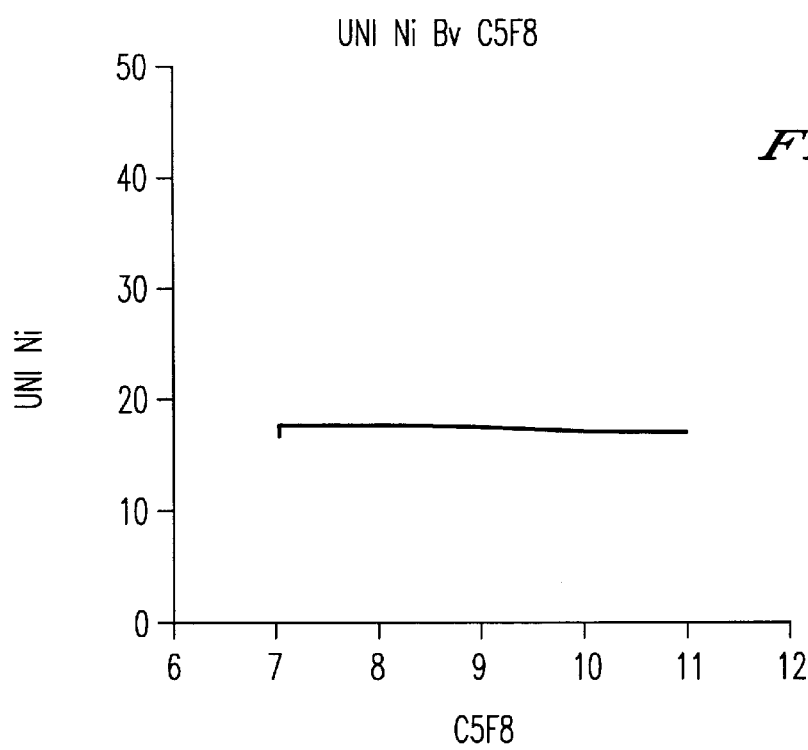
Figure 19E:
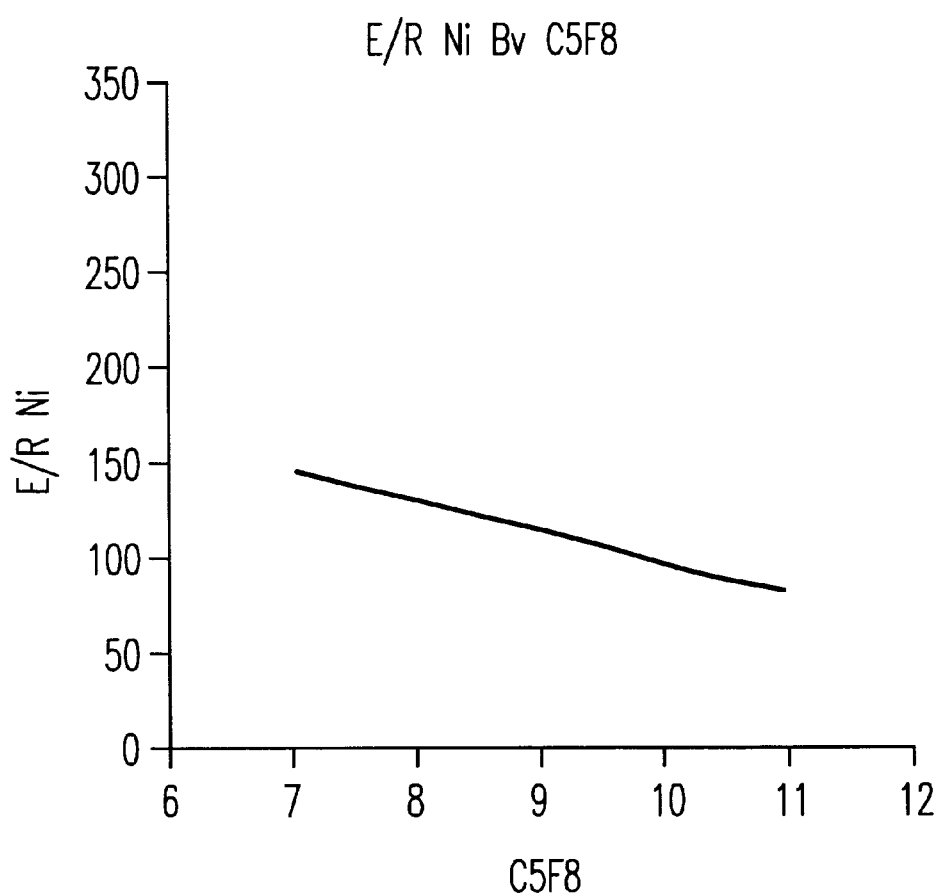

FIGS. 18A and 18B show deposition/etch rates for various flow rates of $C_5F_8$. The curves however are affected by the fact that the rates were determined for a blank wafer rather than a patterned wafer. The blank wafer was 100% exposed to the gas mixture, whereas a patterned wafer is only about 1% exposed. Therefore, the curves of FIGS. 18A and 18B probably reflect processes where the insufficient amount of gas limits or slows the etching. It is believed that the deposition rates for oxide and silicon nitride would be reduced by approximately at least 200 Å/m each for patterned wafers. Thus, silicon nitride would undergo an etch process for flow rates of less than 7 sccm.

FIGS. 19A–19E show approximated linear fits of selectivity, etching rate of an oxide layer, uniformity of a resulting oxide layer, uniformity of a nitride layer, and etching of a nitride layer, respectively.

Obviously, numerous modifications and variations of the present invention are possible in light of the above teachings. It is therefore to be understood that, within the scope of the appended claims, the invention may be practiced otherwise than as specifically described herein.

What is claimed is:

1. A method of etching a silicon oxide layer above a silicon nitride layer over a substrate, comprising the steps of:

placing the substrate in a process chamber;

introducing an etchant gas into said process chamber, said etchant gas comprising $C_5F_8$, a carrier gas, $O_2$ and CO; and etching said silicon oxide layer using said etchant gas.

2. The method according to claim 1, wherein said carrier gas is Ar.

3. The method according to claim 1, wherein the ratio of $C_5F_8$, the carrier gas, $O_2$ and CO is in the range of: 5–15:500:0–100:0–6.

4. The method according to claim 3, wherein the ratio of $C_5F_8$, the carrier gas, $O_2$ and CO is in the range of: 9–11:500:50–100:3–6.

5. The method according to claim 4, wherein the ratio of $C_5F_8$, the carrier gas, $O_2$ and CO is substantially: 9:500:50:3.

* * * * *